(12) United States Patent
See

(10) Patent No.: US 6,348,841 B1
(45) Date of Patent: Feb. 19, 2002

(54) WIDEBAND VOLTAGE CONTROLLED OSCILLATOR WITH GOOD NOISE IMMUNITY

(75) Inventor: Puay Hoe See, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/465,219

(22) Filed: Dec. 15, 1999

Related U.S. Application Data

(60) Provisional application No. 60/152,258, filed on Sep. 1, 1998.

(51) Int. Cl.[7] ............................. H03B 5/08; H03L 7/099
(52) U.S. Cl. .................. 331/167; 331/36 C; 331/177 V
(58) Field of Search ..................... 331/36 C, 177 V, 331/117 R, 117 FE, 167

(56) References Cited

U.S. PATENT DOCUMENTS

| | | | |
|---|---|---|---|
| 4,074,209 A | * | 2/1978 | Lysobey .................. 331/177 V |
| 4,378,534 A | * | 3/1983 | Goedken et al. ......... 331/177 V |
| 4,503,402 A | * | 3/1985 | Englund, Jr. ............. 331/177 V |
| 5,138,285 A | | 8/1992 | Michels ........................ 331/116 |
| 5,937,340 A | | 8/1999 | Philippe et al. .............. 455/310 |

OTHER PUBLICATIONS

Parker, et al., "A Low Noise 1.6–GHz CMOS PLL with On–Chip Loop Filter", IEEE 1997 Custom Integrated Circuits Conference, pp. 407 –410.

* cited by examiner

Primary Examiner—Siegfried H. Grimm
(74) Attorney, Agent, or Firm—Philip R. Wadsworth; Charles D. Brown; Raymond Hom

(57) ABSTRACT

A Voltage Controlled Oscillator (VCO) with the ability to tune its operating frequency over a wide range using a limited control voltage range. The VCO implements a novel resonant circuit that provides the wide frequency tuning range and simultaneously provides increased immunity to induced low frequency noise. The resonant circuit utilizes an element configuration that includes high pass filters on each input to the resonant circuit. Varactor diodes are used to couple a conventional tuning circuit to the remainder of the resonant circuit. This configuration allows the resonant frequency to tune over a wide range using a limited control voltage range.

12 Claims, 4 Drawing Sheets

WIDEBAND VOLTAGE CONTROLLED OSCILLATOR WITH GOOD NOISE IMMUNITY

This application claims benefit of Prov. No. 60/152,258 filed Sep. 1, 1998.

BACKGROUND OF THE INVENTION

I. Field of the Invention

The present invention relates to electronic circuits. More particularly, the present invention relates to a novel and improved wideband Voltage Controlled Oscillator (VCO) having good noise immunity characteristics.

II. Description of the Related Art

Wireless communication systems rely on the predictable performance of over the air Radio Frequency (RF) links. Wireless phone systems are required to simultaneously monitor and control numerous RF links.

A mobile unit or wireless phone integrates numerous complex circuits. An RF transceiver is used to provide the wireless communication link with base stations. The RF transceiver is comprised of a receiver and a transmitter. The receiver receives the RF transmission from the base station via an antenna interfaced to the mobile unit. The receiver amplifies, filters, and downconverts the received signal to baseband signal. The baseband signal is then routed to a baseband processing circuit. The baseband processing circuit demodulates the signal and conditions it for broadcast through a speaker to the user.

Frequency synthesizers are used to generate the local oscillator signals required to perform the downconversion in the receiver and the upconversion in the transmitter. Frequency synthesis is used to generate the local oscillator signal because of the synthesizer's frequency stability, the spectral purity of the resultant signal, and the ability for digital control.

Frequency synthesizers are classified as direct or indirect. In Direct Digital Synthesis logic circuits generate a digital representation of the desired signal and a D/A converter is used to convert the digital representation into an analog waveform. One common way of implementing DDS is to store a table of waveform phases in memory. Then the rate at which the phases are clocked out of memory is directly proportional to the frequency of the output signal. While DDS can generate an extremely accurate representation of a sine wave, the output frequency is limited by the clocking rate.

Indirect synthesis utilizes a phase lock loop locked to the output of an oscillator. Indirect frequency synthesis is more popular for high frequency designs because the output of a high frequency oscillator can be divided down to a frequency within the operating range of the phase lock loop.

FIG. 1 shows a block diagram of an indirect frequency synthesizer utilizing a phase lock loop. A VCO 110 capable of tuning over the desired frequency range is used to provide the LO output 112. The output of the VCO 110 is also sent to the input of a frequency divider circuit 120, denoted ÷N where N represents the divider ratio. The divided output is provided as a first input to a phase detector 130. A second input to the phase detector 130 is the output of a reference oscillator 140. The phase lock loop operates to tune the output of the VCO 110 such that the output of the frequency divider 120 is identical to the output of the reference oscillator 140. The phase detector 130 provides an output signal corresponding to a phase error between the two input signals. The phase detector 130 output is conditioned through a Low Pass Filter (LPF) before it is provided to the frequency control input of the VCO 110. Thus, the VCO 110 is controlled to maintain phase lock with the reference oscillator 140. It can be readily deduced from the block diagram that incrementing or decrementing the value of the divider ratio N results in a frequency change in the LO output 112 equal to the reference oscillator 140 frequency. The frequency of the reference oscillator 140 determines the frequency step size of the LO.

Frequency variations in the VCO 110 output can only be corrected by the phase lock loop if the rate of the frequency variations is less than the loop bandwidth. The phase lock loop is unable to correct for VCO frequency variations that occur at a rate higher than the loop bandwidth. The settling time of the phase lock loop will depend on the initial frequency offset and the loop bandwidth. A wider loop bandwidth results in a faster settling time. A VCO with good noise immunity will reduce frequency variations thereby reducing the settling time of the phase lock loop. Therefore, it is important to design a VCO with good noise immunity while maintaining the frequency tuning characteristics.

A VCO is merely a tunable oscillator. A typical oscillator circuit is comprised of an amplifier and a resonant circuit, commonly referred as a resonant tank. The resulting oscillator has a frequency output where the gain is greater than unity and the phase is equal to zero. The resonant circuit sets this frequency of oscillation. The relationship is most easily seen on a Bode diagram. FIG. 2A illustrates a Bode diagram for a typical oscillator. Curve 210 is representative of the gain in decibels of the oscillator as referenced to the left vertical axis and Curve 220 is representative of the phase in degrees as referenced to the right vertical axis. As indicated by Point 230, the oscillation occurs when the oscillator gain is approximately 14 dB and the phase is zero producing an oscillation at approximately 124 MHz.

To create a VCO the resonant circuit is comprised of at least one variable component wherein the reactance of the variable component is a function of a control signal, typically a voltage level, so that the frequency of zero phase, and consequently the frequency of oscillation, is also variable. When the VCO is required to tune over a large frequency range the variable component must be capable of tuning the resonant circuit over the large frequency range. Possible circuit implementations for a variable resonant circuit capable of covering a large frequency range include a resonant circuit incorporating a highly sensitive variable component or a resonant circuit requiring an extended control voltage range. The first alternative presents some problems because the VCO gain, measured in terms of MHz/Volt, becomes very high. This results in large frequency changes for relatively small control voltage changes and makes the VCO more susceptible to noise induced on the tuning line. The second alternative also has disadvantages since the required control voltage range is very large. Large control voltages can present a problem in mobile battery powered electronics having limited available supply voltage ranges.

It is not sufficient that the resonant circuit tune the oscillator to the desired operating frequency. The Q of the resonant circuit is important in maintaining a specific output frequency at a given control voltage level. FIG. 2B depicts the phase response of two resonant circuits having different Q values. A lower circuit Q generates a more gentle phase response, whereas a higher circuit Q generates a sharper phase response. A higher circuit Q is desired to minimize the effects of small phase variations on output frequency. The phase response of a circuit having a relatively low circuit Q is shown in curve 240. Curve 250 illustrates a circuit having a higher circuit Q. It can be seen for a given phase variation the change in frequency is more pronounced in the circuit having the lower circuit Q. The magnitude of $f_2$, the frequency change in a low Q circuit for a given phase variation, is greater than the magnitude of $f_1$, the frequency change in a high Q circuit for the same phase variation.

Frequency synthesizer IC's are available that integrate nearly all of the required synthesizer circuits onto one chip. Typically, the user of one of these IC's only needs to provide a resonant circuit, loop filter, and reference oscillator in addition to the IC in order to produce a synthesized LO. The remaining elements of the synthesizer, the amplifier portion of the VCO, the frequency divider, and the phase detector, are integrated onto one IC. The user provides the resonant circuit required generating the desired output frequency. The user also provides the low pass filter design generating the desired loop bandwidth.

Although application specific IC's simplify the implementation of the LO in a wireless phone, the wireless phone operating environment presents additional noise sources which must be considered. Cost and space limitations in a wireless phone further constrain available noise filtering solutions.

The mobile phone design differs greatly depending on the particular mobile system it is supporting. Specifications outlining mobile phone design include Telecommunications Industry Association (TIA)/Electronic Industries Association (EIA) IS-95-B MOBILE STATION-BASE STATION COMPATABILITY STANDARD FOR DUAL-MODE SPREAD SPECTRUM SYSTEMS as well as TIA/EIA IS-98-B, RECOMMENDED MINIMUM PERFORMANCE STANDARDS FOR DUAL-MODE SPREAD SPECTRUM CELLULAR MOBILE STATIONS. The specification covering the operation of a CDMA system in the Personal Communication Systems (PCS) band is the American National Standards Institute (ANSI) J-STD-008 PERSONAL STATION-BASE STATION COMPATIBILITY REQUIREMENTS FOR 1.8 TO 2.0 GHZ CODE DIVISION MULTIPLE ACCESS (CDMA) PERSONAL COMMUNICATIONS SYSTEMS. Similarly, the phone, or personal station, is specified in ANSI J-STD-018, RECOMMENDED MINIMUM PERFORMANCE REQUIREMENTS FOR 1.8 TO 2.0 GHZ CODE DIVISION MULTIPLE ACCESS (CDMA) PERSONAL STATIONS. Additionally, the mobile phone specification defines features which, when implemented in phone hardware, tend to increase sources of noise within the phone.

One beneficial feature that is utilized in CDMA phone systems such as those specified in IS-95 and J-STD-008 is multiple data rate sets. In order to take advantage of the variable nature of a wireless phone communication link, the CDMA specifications provide for data transmission at reduced rates. When a person is engaged in a telephone conversation there are numerous periods in which only one party will be speaking. During periods of reduced speech activity the telephone can reduce the data rate of the transmission resulting in a lower average transmit power level.

The communication link from the wireless phone back to the base station is termed the reverse link. On the reverse link, reduction in average transmit power is accomplished by turning off the transmitter for a fraction of the time during periods when activity is low. In a CDMA reverse link the phone always transmits at the full data rate however, when the internal structure allows operation at a reduced data rate the data is repeated a number of times. As an example, when the phone is able to operate at one-half of the full data rate the information is repeated twice to bring the transmitted data rate up to the full data rate. Similarly, one-fourth rate data is repeated four times to achieve a full data rate.

To conserve power on the reverse link, each 20 mS data frame is subdivided into sixteen 1.25 mS time groupings. When the phone is operating at a full data rate all sixteen of the groups within the frame are transmitted. However, when the phone is operating at a reduced data rate only a fraction of the sixteen groups is transmitted. The fraction of groups transmitted is equal to the reduction in the data rate. When the phone operates at one-half the full data rate one-half of the groups is transmitted. However, note that no data is lost since data is repeated in inverse proportion to the data rate reduction. One-half rate data is repeated twice but only half of the data is transmitted. The redundant portion of the data is not transmitted. Similarly, one-eighth rate data is repeated eight times but only one-eighth of the data is transmitted.

When the phone operates at a reduced data rate, DC power is gated to select active circuits on the transmit path. The DC power to the circuits is gated off when the data is not being transmitted. The DC power is gated back on to the circuits prior to transmitting the desired data group. Power gating serves to conserve power within the wireless phone. This results in a much desired extended battery life.

An adverse effect of power gating is the sudden load changes applied to the phone power supply. The portions of the RF transmit path that are switched on and off present the greatest loads on the power supply. Therefore, during power gating, the phone power supply is subjected to the greatest load variations that it will experience. Since no power supply is insensitive to load variations the output of the power supply will exhibit voltage ripple at the rate that power gating occurs. The actual voltage ripple on the supply voltage lines is a function of the power supply load rejection, the rate of power gating, and the change in power supply load due to power gating. The change in power supply load varies in relation to the RF communication link the phone is maintaining with the base station. The change in load current will be greater when the phone is transmitting at a higher RF power level than when the phone is transmitting at a decreased RF power level. The power gating may occur at each 1.25 mS time grouping used for each data frame on the reverse link. This results in a power supply load variation with a significant 800 Hz frequency component.

What is desired is a voltage controlled oscillator design that maintains a stable output frequency with a constant control voltage applied. The VCO must be able to be tunable over a large frequency range. The wideband tuning ability allows a single VCO to be used in multiple band wireless phone applications. The VCO output must also be insensitive to power supply noise. Specifically, when the VCO is implemented in a CDMA phone the VCO output must be insensitive to power supply noise created by power gating the RF transmit path. Another object of the invention is the design of a high Q, low cost, low component count, wide range, noise insensitive circuit for use as a resonant circuit within a VCO.

It should be noted that CDMA wireless system specifications are used only to provide examples of the environment that a VCO may be subjected. A wideband, noise insensitive, VCO can be utilized in many applications. The use of the CDMA system as an example environment in no way limits the potential applications of the VCO.

SUMMARY OF THE INVENTION

The present invention is a novel and improved wideband Voltage Controlled Oscillator (VCO) having increased noise immunity. Additionally, the invention may be viewed as a novel resonant circuit configuration that is tunable over a wide range of resonant frequencies, has high Q, and is insensitive to noise. The novel resonant circuit can be implemented with an amplifier or application specific integrated circuit to generate a VCO having the characteristics of wideband coverage, noise insensitivity, and frequency stability.

The resonant circuit of the present invention is composed of a first coupling capacitor with a first end that serves as a first input to the resonant circuit. A second coupling capacitor uses a first end that serves as a second input to the resonant circuit. A first inductor connects from the second end of the first coupling capacitor to signal ground. Similarly, a second inductor connects a second end of the second coupling capacitor to signal ground. A first tuning capacitor connects the second end of the first coupling capacitor to a first end of a variable element. A second tuning capacitor connects the second end of the second coupling capacitor to a second end of the variable element.

In the preferred embodiment both the first and second tuning capacitors are variable capacitors. The variable capacitors are preferably varactor diodes. The first tuning capacitor is a varactor diode with its anode connected to the second end of the first coupling capacitor. The second tuning capacitor is a varactor diode with its anode connected to the second end of the second coupling capacitor.

Additionally, in the preferred embodiment the variable element is composed of two variable capacitors each implemented as a varactor diode. The variable element is composed of a first varactor diode having its cathode as the first end of the variable element. A second varactor diode having its cathode as the second end of the variable element forms the remainder of the variable element. The anodes of both the first and second varactor diodes used in the variable element are connected to signal ground.

A control voltage is applied to the cathodes of all of the varactor diodes to tune the resonant frequency of the resonant circuit.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
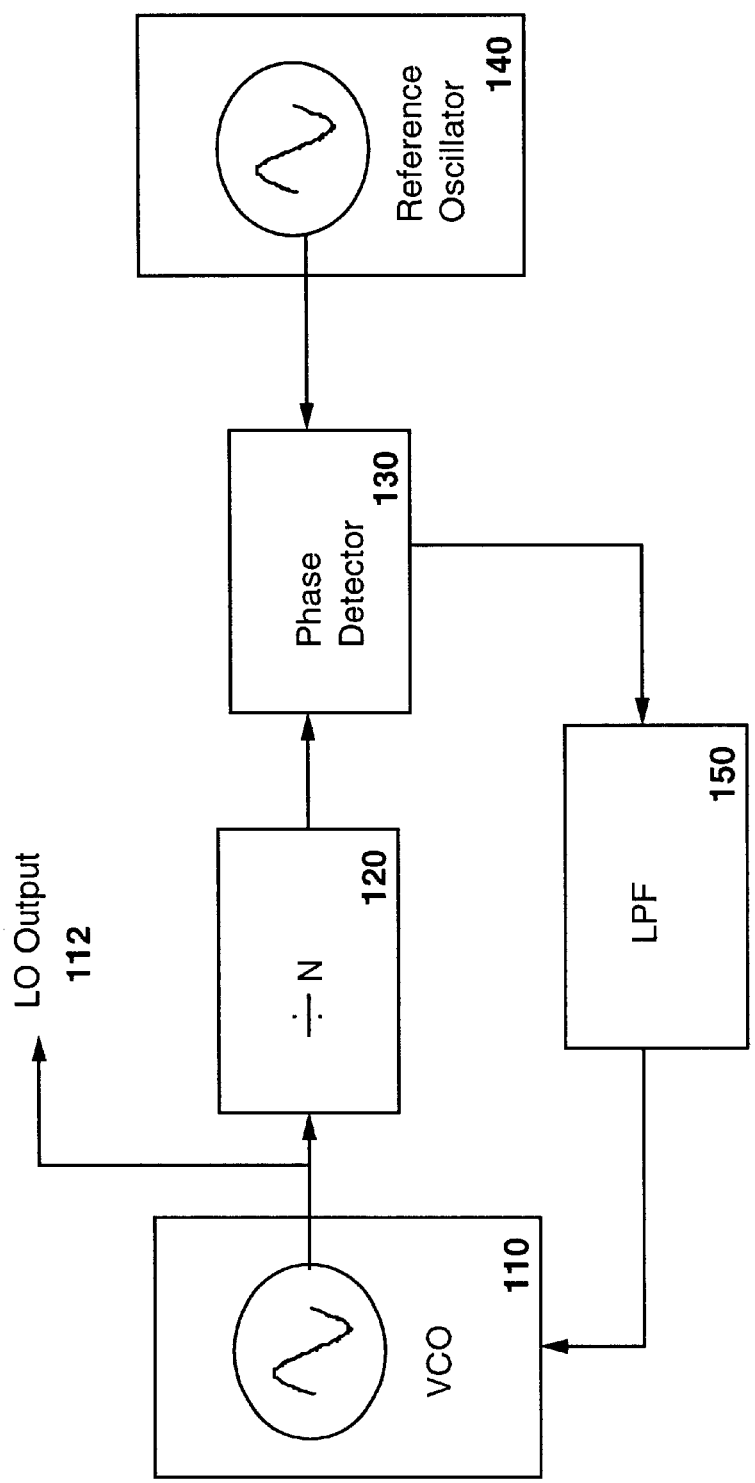
FIG. 1 is a block diagram of a synthesized local oscillator.
Figure 2A:
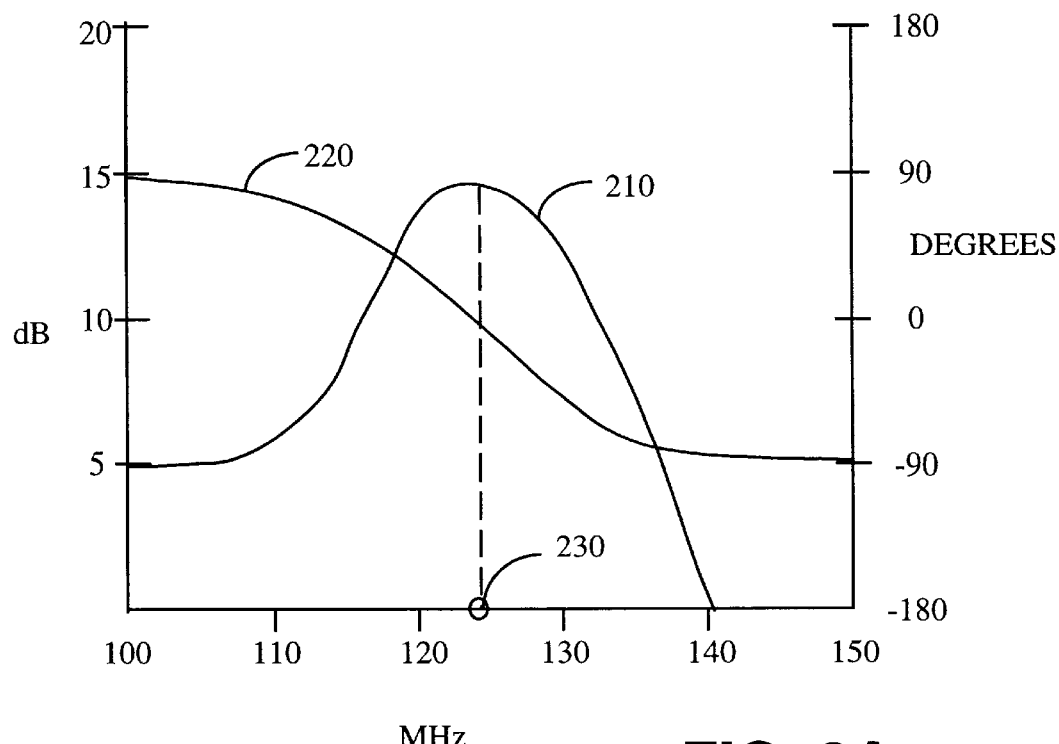
FIGS. 2A–2B are amplitude and phase plots characterizing oscillator circuits.
Figure 2B:
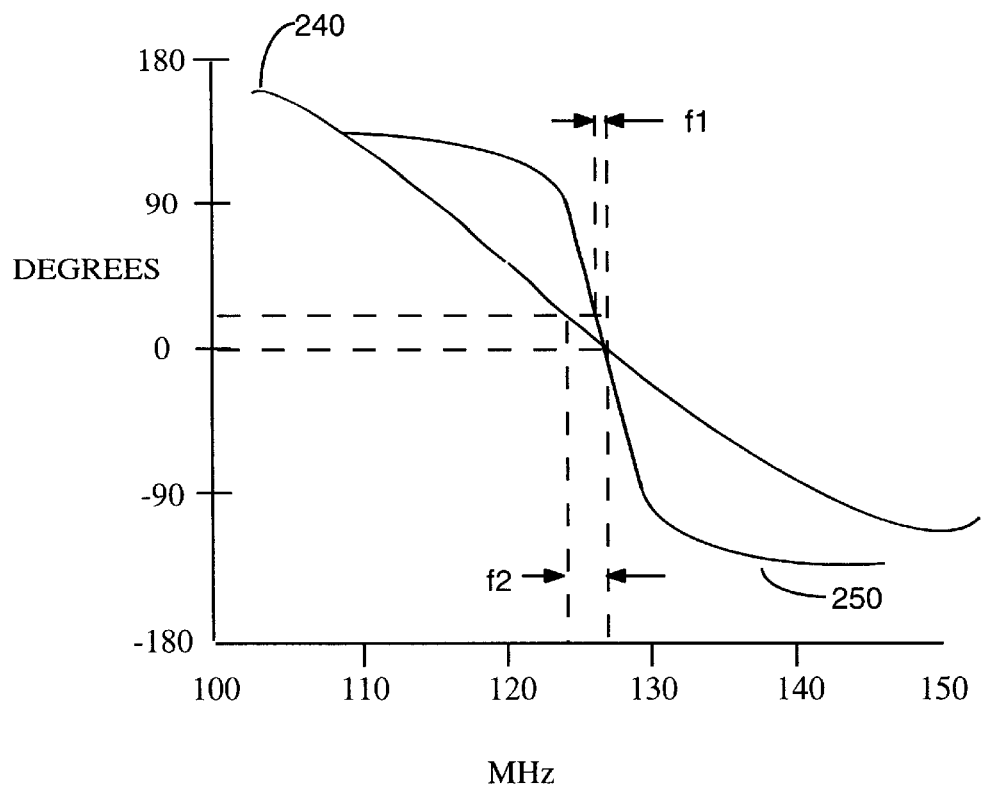
Figure 3:
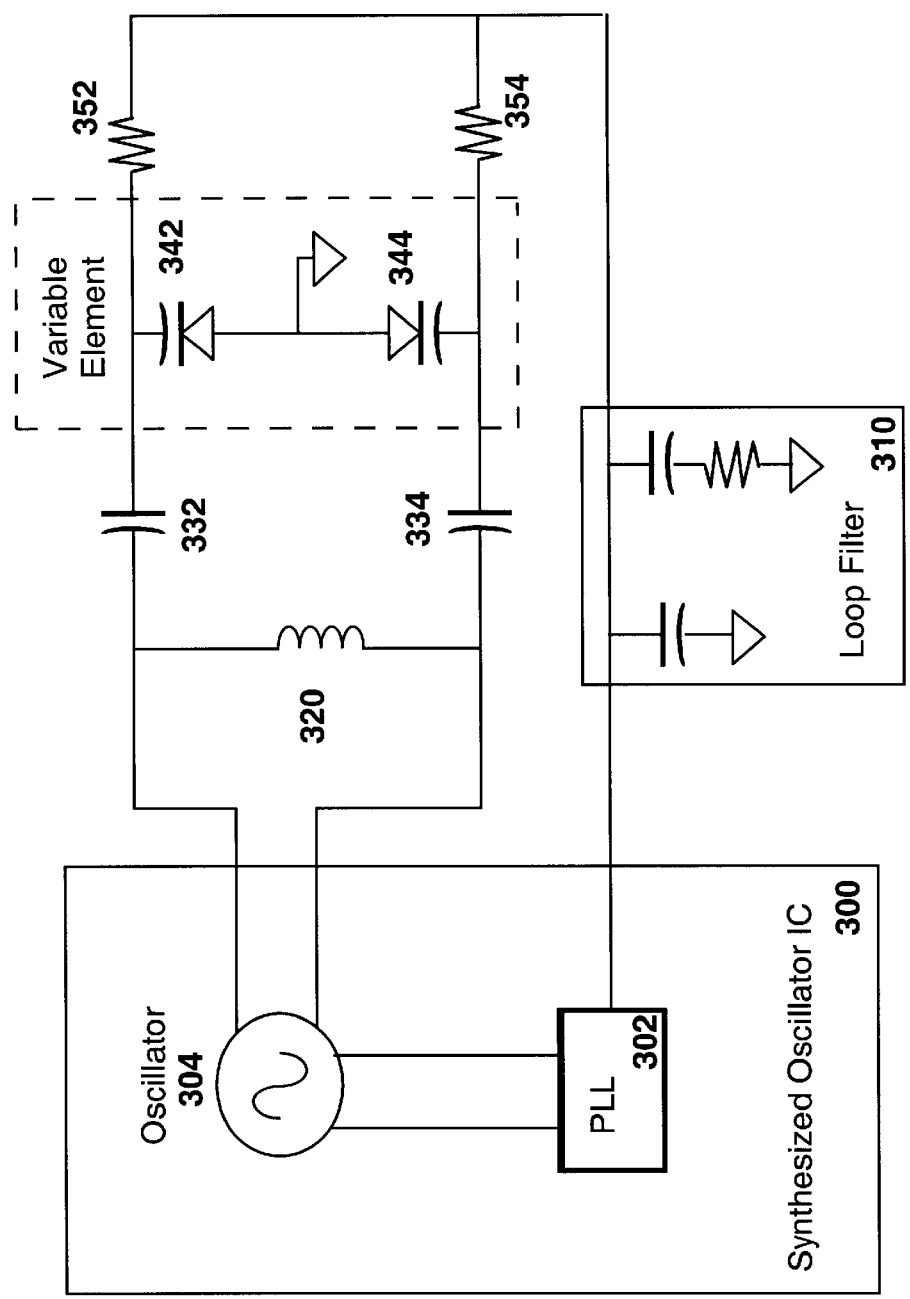
FIG. 3 is a block diagram of an integrated circuit synthesized oscillator.

FIG. 3 illustrates a block diagram of a typical local oscillator implementation used in a wireless phone. A synthesized oscillator IC 300 incorporates a Phase Lock Loop (PLL) 302 as well as an amplifier configured as an oscillator 304. The synthesized oscillator IC 300 requires an external resonant circuit and loop filter 310 in order to operate. The oscillator 304 is configured as a Voltage Controlled Oscillator (VCO) if the resonant circuit can be tuned by the application of a control voltage.

The resonant circuit is comprised of an inductor 320 in parallel with a capacitive network. The capacitive network is comprised of fixed capacitors and variable capacitors. The capacitive network utilizes first and second variable capacitors, 342 and 344 respectively, connected in series. The first variable capacitor 342 is connected to a first side of the inductor 320 through a first tuning capacitor 332. The second variable capacitor 344 is connected to the second side of the inductor 320 through a second tuning capacitor 334. The point where the first variable capacitor 342 connects to the second variable capacitor 344 is tied to signal ground.

The oscillator 304 within the synthesized oscillator IC 300 operates at the resonant frequency of the resonant circuit. A sample of the output of the oscillator 304 is routed to the PLL 302. The PLL 302 compares the phase of the oscillator 304 output signal against a reference signal (not shown). The resultant error signal is passed through a loop filter 310 then is applied to the variable elements in the resonant circuit. The output of the loop filter 310 is applied to the variable capacitors, 342 and 344, through first and second bias resistors, 352 and 354. A first bias resistor 352 connects the output of the loop filter 310 to the terminal of the first variable capacitor 342 that is connected to the first tuning capacitor 332. Similarly, a second bias resistor 354 is used to connect the output of the loop filter 310 to the terminal of the second variable capacitor 344 that is connected to the second tuning capacitor 334. The first variable capacitor 342 and the second variable capacitor 344 may be implemented as varactor diodes. The output of the loop filter 310 is used to reverse bias the varactor diodes. The varactor diodes change their capacitance values based on the level of reverse bias applied. Therefore, by controlling the varactor diode reverse bias voltage the frequency of the oscillator can be controlled. The PLL 302 varies the control voltage to maintain phase lock.

When a wireless phone LO is configured as shown in FIG. 3 the oscillator 304 can only tune over the range of the resonant circuit. If the oscillator 304 is required to tune over a large frequency span such that the phone can cover multiple frequency bands, the resonant circuit must be capable of tuning over the entire range.

Figure 4:
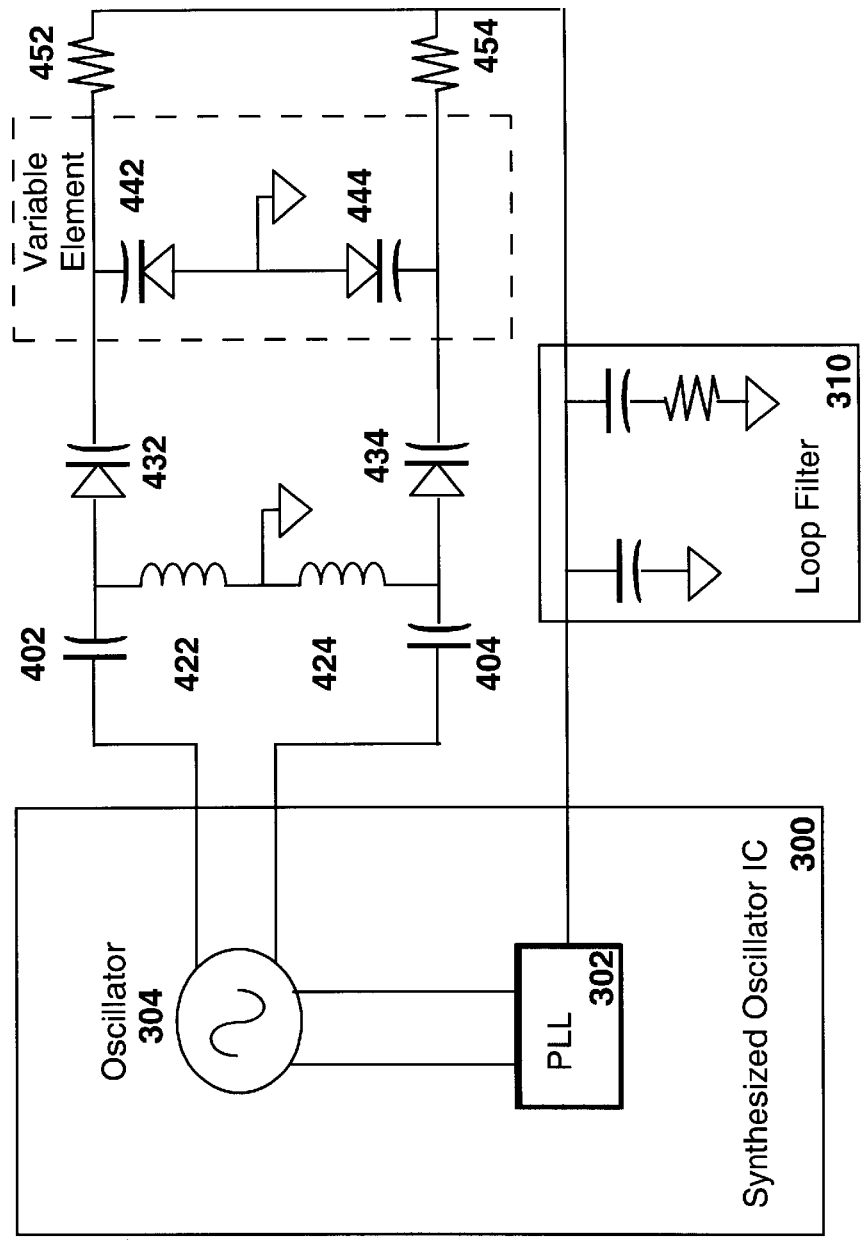
FIG. 4 is a block diagram of the preferred embodiment of the present invention.

FIG. 4 illustrates a local oscillator implementing the VCO and resonant circuit of the present invention. The resonant circuit of the present invention allows the VCO to tune over a very wide band. At the same time the resonant circuit is configured to be relatively insensitive to low frequency noise. The VCO using the resonant circuit has increased noise immunity because the resonant circuit is insensitive to noise.

The resonant circuit of the present invention utilizes inductive elements coupled to a variable element using variable capacitors. Additional coupling capacitors are used as inputs to the resonant circuit. The coupling capacitors serve to interface the input connections of the resonant circuit to the inductive elements. The configuration of the coupling capacitors and the inductive elements present a high pass filter to signals appearing on the resonant circuit input connections. Therefore, the high pass filter attenuates any low frequency noise input to the resonant circuit. The variable capacitors in the resonant circuit are only exposed to attenuated noise. The configuration of the variable capacitors and the variable element serves to further diminish the effects of low frequency noise.

In the preferred embodiment of the present invention the two input terminals of the resonant circuit connect to capacitors. A first coupling capacitor 402 connects to a first input connection of the resonant circuit. A second coupling capacitor 404 connects to a second input connection of the resonant circuit. The end of the first coupling capacitor 402 opposite the input connection is connected to a first inductor 422. The end of the first inductor 422 opposite the first coupling capacitor 402 is connected to signal ground. Similarly, the end of the second coupling capacitor 404 opposite the input connection is connected to a second inductor 424. The end of the second inductor 424 opposite the second coupling capacitor 404 is connected to signal ground. The configuration of the coupling capacitors and inductors form two pole high pass filters when viewed from either of the resonant circuit input connections. Thus, any low frequency noise that is induced on the input connections of the resonant circuit will be attenuated by the high pass filter configuration of the coupling capacitor and inductor.

A first tuning capacitor 432 connects the junction of the first coupling capacitor 402 and the first inductor 422 to a first terminal of a variable element. A second tuning capacitor 434 connects the junction of the second coupling capacitor 404 and the second inductor 424 to a second terminal of the variable element. In the preferred embodiment both the first tuning capacitor 432 and the second tuning capacitor 434 are variable capacitors implemented as varactor diodes. In the preferred embodiment the first tuning capacitor 432 is a varactor diode having its anode connected to the junction of the first coupling capacitor 402 and first inductor 422. The cathode of the varactor is connected to the variable element. Similarly, the second tuning capacitor 434 is a varactor with its anode connected to the junction of the second coupling capacitor 404 and second inductor 424.

The variable element can be any variable reactive element. In the preferred embodiment the variable element is a variable capacitor. In the preferred embodiment the variable element is implemented using two varactor diodes. A first varactor diode 442 is configured with its cathode as the first terminal of the variable element. In the preferred embodiment the cathode of the first varactor diode 442 is connected to the cathode of the varactor diode used as the first tuning capacitor 432. The anode of the first varactor diode 442 is connected to signal ground. A second varactor diode 444 is configured with its cathode as the second terminal of the variable element. In the preferred embodiment the cathode of the second varactor diode 444 is connected to the cathode of the varactor diode used as the second tuning capacitor 434. The anode of the second varactor diode 444 is connected to signal ground.

The DC bias that controls the value of the variable capacitors is applied through two bias resistors. A first bias resistor 452 connects the cathodes of the first tuning capacitor 432 and the first varactor diode 442 to the control voltage. Similarly, a second bias resistor 454 connects the cathodes of the second tuning capacitor 434 and the second varactor diode 444 to the control voltage. The two bias resistors 452 and 454 isolate the bias voltage on the first pair of varactor diodes (432 and 442) from the bias voltage on the second pair of varactor diodes (434 and 444).

An examination of the resonant circuit of the preferred embodiment reveals that it is a completely balanced circuit configuration. The impedance viewed from the first input connection of the resonant circuit is identical to the impedance viewed from the second input connection to the resonant circuit. It can readily be determined that the resonant circuit can be modified to operate in a single ended configuration for use in designs requiring a single ended resonant circuit. To modify the balanced resonant circuit configuration into a single ended resonant circuit configuration all of the circuit elements connected to the second input terminal of the balanced resonant circuit are removed.

Two separate circuit topologies implemented in the resonant circuit contribute to noise immunity. Only one half of the resonant circuit will be described although it is obvious from the balanced circuit configuration how the elements in the second half of the balanced circuit contribute similarly to noise rejection.

The first coupling capacitor 402 in conjunction with the first inductor 422 present a two pole high pass filter when viewed from the resonant circuit input terminal. Low frequency noise induced on the input terminal of the resonant circuit is attenuated by this two pole high pass filter. The circuit configuration of the first tuning capacitor 432 and the first varactor diode 442 also contributes to noise rejection. The first tuning capacitor 432 is implemented using a varactor diode. In the preferred embodiment, the first tuning diode 432 uses the same varactor as used for the first varactor diode 442. The first tuning diode 432 and the first varactor diode 442 appear as a capacitive voltage divider when viewed from the anode of the first tuning capacitor 432. The impedance of the first tuning capacitor 432 and the first varactor diode 442 are the same since they are chosen to be the same part. Therefore, any noise contribution at the anode of the first tuning capacitor 432 is attenuated by the voltage divider configuration. The resonant circuit connects the cathodes of the first tuning capacitor 432 and the first varactor diode 442 at the same node. Therefore, any AC noise that is coupled onto the first tuning capacitor 432 and the first varactor diode 442 via the anode of the first tuning capacitor 432 will affect the bias to the two varactors in an opposite manner. AC noise that is coupled to the capacitive voltage divider will appear across the first tuning capacitor 432 in an opposite polarity as that appearing across the first varactor diode 442. The effect is to further attenuate the effects of AC noise on the resonant circuit. As the AC noise increases the reverse bias voltage on the first tuning capacitor 432 the reverse bias voltage on the first varactor diode 442 is correspondingly decreased. This does not entirely cancel the effects of noise on the varactor diodes but diminishes the effects of noise. At the same time the varactor diodes appear in parallel to the control voltage and thus serve to extend the tuning range of the resonant circuit. A 25% tuning bandwidth has been verified using this configuration.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A balanced, wideband, noise insensitive, resonant circuit comprising:

a first filter element as a first balanced input to the resonant circuit;

a first variable capacitor;

a first tuning capacitor coupling an output of the first filter element to the first variable capacitor;

a second filter element as a second balanced input to the resonant circuit;

a second variable capacitor; and a second tuning capacitor coupling an output of the second filter element to the second variable capacitor;

wherein the capacitances of the first and second tuning capacitors and the first and second variable capacitors are adjusted by the application of a control voltage and the resonant frequency of the resonant circuit is determined by the first and second filter elements, the first and second tuning capacitors and the first and second variable capacitors.

2. The resonant circuit of claim 1 wherein each of the first and second filter elements are identical high pass filters.

3. The resonant circuit of claim 1 wherein each of the first and second filter elements comprise:

a coupling capacitor; and an inductor connecting from the coupling capacitor to signal ground.

4. The resonant circuit of claim 1 wherein the first and second tuning capacitors and the first and second variable capacitors are each varactor diodes.

5. The resonant circuit of claim 4 wherein a cathode of each of the varactor diodes corresponding to the first tuning capacitor and the first variable capacitor share a first node.

6. The resonant circuit of claim 5 wherein a cathode of each of the varactor diodes corresponding to the second tuning capacitor and the second variable capacitor share a second node.

7. A Voltage Controlled Oscillator (VCO) with wide tuning range and improved noise insensitivity comprising:

an amplifier; and a balanced resonant circuit comprising;

a first filter element as a first balanced input to the balanced resonant circuit;

a first variable capacitor;

a first tuning capacitor coupling an output of the first filter element to the first variable capacitor;

a second filter element as a second balanced input to the balanced resonant circuit;

a second variable capacitor; and a second tuning capacitor coupling an output of the second filter element to the second variable capacitor;

wherein the amplifier is connected to the balanced resonant circuit to produce an oscillator and the capacitances of the first and second tuning capacitors and the first and second variable capacitors are adjusted by the application of a control voltage and the resonant frequency of the balanced resonant circuit is determined by the first and second filter elements, the first and second tuning capacitors and the first and second variable capacitors.

8. The VCO of claim 7 wherein each of the first and second filter elements are identical high pass filters.

9. The VCO of claim 7 wherein each of the first and second filter elements comprise:

a coupling capacitor; and an inductor connecting from the coupling capacitor to signal ground.

10. The VCO of claim 7 wherein each the first and second tuning capacitors and the first and second variable capacitors are each varactor diodes.

11. The VCO of claim 10 wherein a cathode of each of the varactor diodes corresponding to the first tuning capacitor and the first variable capacitor share a first node.

12. The VCO of claim 11 wherein a cathode of each of the varactor diodes corresponding to the second tuning capacitor and the second variable capacitor share a second node.

* * * * *